United States Patent [19]

Perroud et al.

[11] Patent Number: 5,045,810
[45] Date of Patent: Sep. 3, 1991

[54] BROADBAND AMPLIFIER WITH A CONSTANT GAIN AND A DETERMINED INPUT IMPEDANCE AT HIGH FREQUENCY

[75] Inventors: Philippe Perroud, Meylan; Jean-Luc Jaffard, Saint-Egreve, both of France

[73] Assignee: SGS-Thomson Microelectronics S.A., Gentilly, France

[21] Appl. No.: 542,383

[22] Filed: Jun. 22, 1990

[30] Foreign Application Priority Data

Jun. 23, 1989 [FR] France .................. 89 08567

[51] Int. Cl.$^5$ ............................................ H03F 1/34
[52] U.S. Cl. .................................... 330/293; 330/294
[58] Field of Search ............... 330/109, 278, 281, 285, 330/293, 294, 296

[56] References Cited

U.S. PATENT DOCUMENTS

| | | | |
|---|---|---|---|
| 3,379,988 | 4/1968 | Graham | 330/293 X |
| 3,530,392 | 9/1970 | Hirst | 330/293 |
| 3,534,281 | 10/1970 | Hillhouse | 330/293 |
| 4,041,411 | 8/1977 | Sturgeon | 330/201 A |

OTHER PUBLICATIONS

Japanese Abstracts, vol. 4, No. 175 (E-36) (657).
Radio Fernsehen Elektronik, vol. 3, No. 2, Feb. 1985, p. 131.

Primary Examiner—Steven Mottola
Attorney, Agent, or Firm—Lowe, Price, LeBlanc and Becker

[57] ABSTRACT

A broadband amplifier comprises a bipolar transistor (T), having a base connected to the input terminal (2), a collector connected to the output terminal (3) which is in turn connected to a supply source (11) through a first resistor (R1), and an emitter grounded. A second resistor (R2), the value of which varies simultaneously with the current gain ($\beta$) of the transistor is connected between the output terminal and the transistor base. This broadband amplifier further comprises a capacitor (C) connected in parallel across the terminals of the second resistor and a third resistor (R3) connected between the second resistor and the transistor base.

3 Claims, 1 Drawing Sheet

BROADBAND AMPLIFIER WITH A CONSTANT GAIN AND A DETERMINED INPUT IMPEDANCE AT HIGH FREQUENCY

BACKGROUND OF THE INVENTION

The present invention relates to a broadband voltage amplifier and more particularly to an amplifier adapted to process signals from an inductive component such as the magnetic reading head of a video tape recorder (VTR).

FIG. 1 very schematically shows such an inductive component 1 connected to the input terminal 2 of an amplifier A which amplifies the voltage between this input terminal 2 and an output terminal 3. This amplifier is liable to be a preamplifier constituting the input stage of an amplification circuit comprising other components.

FIG. 2 shows a conventional implementation of an amplifier A. It comprises:

a supply source 11, the first terminal 12 of which is connected to the output terminal through a resistor R1 and the second terminal 13 is grounded, an NPN bipolar transistor T, the base of which is connected to the input terminal 2, the collector is connected to the output terminal 3 and the emitter is grounded, and a resistor R2 connected between the collector and the base of transistor T.

The supply source 11 serves to polarize transistor T through resistors R1 and R2.

The voltage gain G1 of amplifier A is written:

$$G1 = (\Delta V/VT)(R1/\{[R1+(R2/\beta)]\}), \quad (1)$$

where:

VT is a coefficient depending upon the temperature, $\Delta V$ is the voltage difference between the voltage on the output terminal and the voltage on the input terminal, and $\beta$ is the gain of transistor T, equal to the ratio between the collector current IC and the base current IB.

With conventional constant resistor R1 and R2, it is clear that gain G1 depends upon $\beta$. This gain $\beta$ is liable to substantially vary from one transistor to another. Indeed, it particularly depends upon the base thickness which is very low and that cannot be determined and reproduced with a high accuracy.

Then, in the circuit of FIG. 2, a resistor R2, associated during manufacturing to the gain $\beta$ of the transistor, has been provided. To manufacture this type of resistor, called pinched-base resistor, a first diffusion is carried out (base area) simultaneously with the base regions of the transistors. Then, a shallower additional area, which is of the same nature, is carried out simultaneously with the emitter regions of the transistors. The resistor value depends upon the thickness between the lower limits of the two diffusions (a pinch has been achieved), in the same way $\beta$ depends upon the thickness between the lower limit of the base region and the lower limit of the emitter region. Consequently, resistor R2 varies proportionally to $\beta$. Then, gain G1 of the amplifier no longer depends upon $\beta$.

However, the formation of a constant voltage gain implies that the amplifier input impedance Z1 ($Z1 = R2 \cdot VT/\Delta V$), which is proportional to R2, is no longer determined in a reproducible way from one amplifier to another.

This non-reproducibility of the input impedance is a drawback in case of application to the amplification of signals from the reading head of a video tape recorder. Indeed, the frequency of the signals applied to the input terminal of the amplifier is then liable to vary within a broad frequency band, for example between 100 kHz and 10 MHz. Then, the head impedance is substantially variable and of the same order of magnitude as the input impedance of the preamplifier. As a result, the effective gain of the preamplifier is not determined and is not reproducible from one manufacturing batch to another.

An object of the invention is to provide for a constant voltage gain within a broadband from one amplifier to another and with a determined and low input impedance at high frequency.

SUMMARY OF THE INVENTION

This object is achieved by providing a broadband amplifier between an input terminal and an output terminal comprising a bipolar transistor having a base connected to the input terminal, a collector connected to the output terminal which is in turn connected to a supply source through a first resistor, and an emitter grounded; a second resistor, the value of which varies simultaneously with the current gain of the transistor, connected between the output terminal and the transistor base; a capacitor connected in parallel across the terminals of the second resistor; and a third resistor connected between the second resistor and the transistor base.

Preferably, the value of the third resistor is substantially lower than that of the second resistor, whereby the amplifier impedance is determined and low at high frequency.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1, already described, very schematically shows an amplifier connected to an inductive component.

FIG. 2, already described, shows an amplifier according to the prior art; and

FIG. 3 shows an amplifier according to the invention.

DESCRIPTION OF A PREFERRED EMBODIMENT

Figure 1:
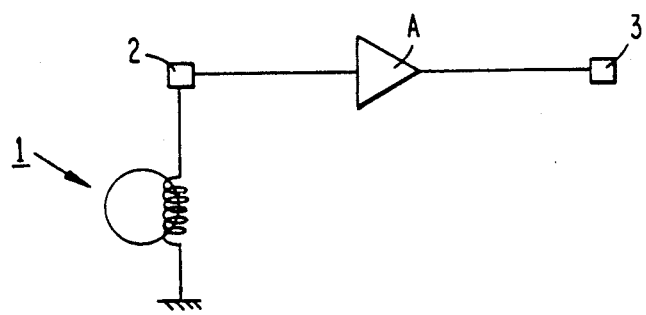
Figure 2:
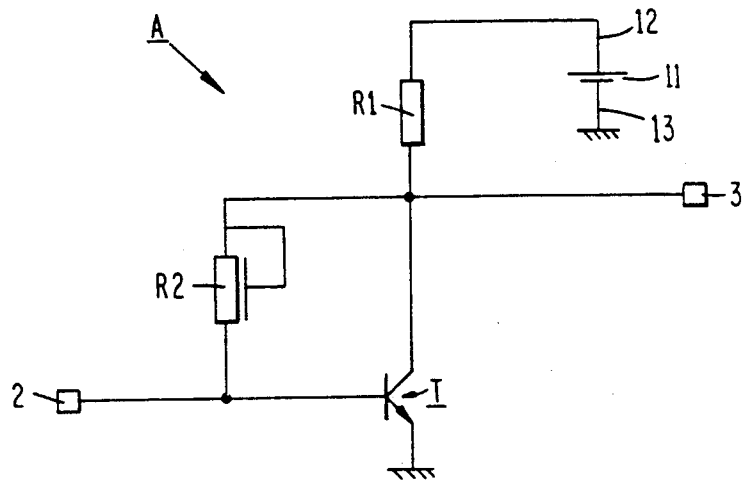
Figure 3:
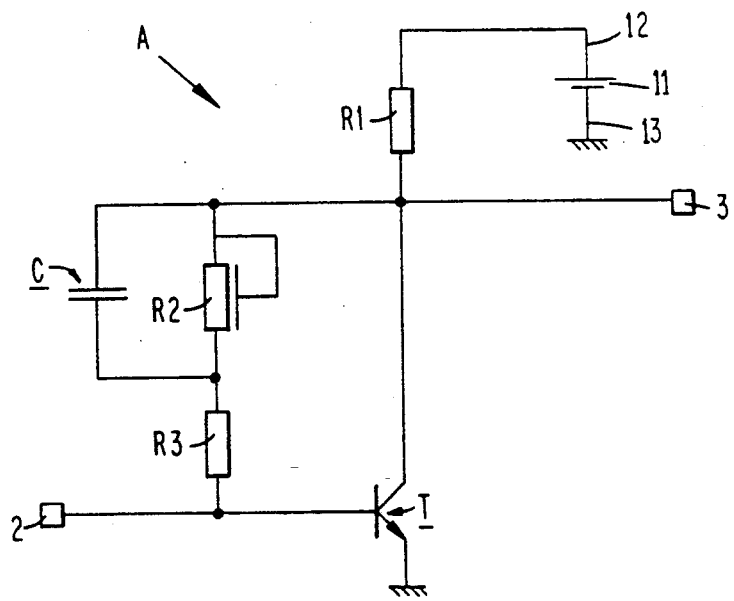

FIG. 3 shows an embodiment of an amplifier according to the invention. As in FIG. 2, it comprises an amplifier connected between an input terminal 2 and an output terminal 3. A supply source 11 is connected, on the one hand, to the output terminal through a resistor R1 and, on the other hand, to the ground. A transistor T has its base connected to the input terminal, its collector connected to the output terminal and its emitter grounded.

A resistor of the pinched-base type has a first terminal connected to the output temrminal. A resistor R3 is added in series between the second terminal of resistor R2 and the base of transistor T. A capacitor C is also added in parallel across the terminals of resistor R2.

The supply source polarizes transistor T through resistor R1, R2 and R3. The voltage gain G2 of this amplifier A is written:

$$G2 = (\Delta V/VT)\{R1/[R1+(R2+R3)/\beta]\} \quad (2)$$

The value of resistor R2, which is proportional to $\beta$, is chosen so as to be high with respect to resistor R3; the values of those resistors are for example R2=150 k$\Omega$ and R3=30 k$\Omega$. Thus, it is possible to neglect R3 with respect to R2 in equation (2), and then equation (2) becomes substantially identical to relation (1). Thus, gain G2 is very little dependent upon $\beta$.

In addition, the input impedance Z2 of the amplifier as a function of frequency w is given by:

$$Z2(w) = (VT/\Delta V)[R3 + R2/(1 + R2Cw)] \quad (3)$$

For higher frequencies, the value of R2Cw becomes high with respect to 1 and this input impedance is:

$$Z2(w) = (VT/\Delta V)[R3];$$

it no longer depends upon R2 but upon R3 only.

Since resistor R3 has a determined and reproducible value, a preamplifier with a constant voltage gain (and therefore with a determined noise current) has been achieved owing to the choice of R2, and with a determined and reproducible input impedance at high frequency owing to the choice of R3.

By way of example, for a reading head having an impedance liable to vary between 50$\Omega$ at low frequency and 1000$\Omega$ at 10 MHz, it will be possible to choose:

R1 = 1.2 k$\Omega$

R2 = 150 k$\Omega$

R3 = 30 k$\Omega$

C = 10 pF.

Then, with $\beta=50$, $\Delta V=4.4$ V and VT=0.026 V, the value of R2Cw becomes high with respect to 1 as soon as the frequency exceeds about a hundred kHz. Then, the input resistance becomes constant and about 200$\Omega$ white the voltage gain remains substantially equal to 50.

The invention such as described above is liable of numerous variants and modifications which will appear to those skilled in the art. The amplifier may for example be formed by using a PNP bipolar transistor technology instead of NPN transistors. Moreover, an additional bipolar transistor can be added in series between the collector of transistor T and the output terminal (transistor T is cascode connected) to allow high frequency operation.

We claim:

1. A broadband amplifier comprising:
   an input terminal;
   an output terminal;
   a bipolar transistor having a base connected to the input terminal, a collector connected to the output terminal which is in turn connected to a supply source through a first resistor, and an emitter grounded,
   a second resistor, the value of which varies simultaneously with the current gain of the transistor connected between the output terminal and the transistor base,
   a capacitor connected in parallel across the terminals of the second resistor, and
   a third resistor connected between the second resistor and the transistor base.

2. A broadband amplifier according to claim 1, wherein the value of the third resistor is lower than that of the second resistor, whereby the amplifier impedance is low at high frequency.

3. A broadband amplifier according to claim 1, wherein the second resistor is of the pinched-base type.

* * * * *